US008587459B2

(12) United States Patent
Perez Chamorro et al.

(10) Patent No.: US 8,587,459 B2
(45) Date of Patent: Nov. 19, 2013

(54) METHOD FOR ENCODING DATA WITH AT LEAST TWO ENCODING STEPS, AND AT LEAST ONE PERMUTATION STEP, CORRESPONDING ENCODING DEVICE, COMPUTER PROGRAM AND SIGNAL

(75) Inventors: Jorge Perez Chamorro, Aix en Provence (FR); Cyril Lahuec, Lampaul Plouarzel (FR); Fabrice Seguin, Morlaix (FR); Matthieu Arzel, Plouzane (FR)

(73) Assignee: Institut Telecom/Telecom Bretagne, Brest Cedex 3 (FR)

( * ) Notice: Subject to any disclaimer, the term of this patent is extended or adjusted under 35 U.S.C. 154(b) by 98 days.

(21) Appl. No.: 13/147,354

(22) PCT Filed: Jan. 29, 2010

(86) PCT No.: PCT/EP2010/051125
§ 371 (c)(1),
(2), (4) Date: Nov. 11, 2011

(87) PCT Pub. No.: WO2010/086424
PCT Pub. Date: Aug. 5, 2010

(65) Prior Publication Data
US 2012/0057648 A1    Mar. 8, 2012

(30) Foreign Application Priority Data

Jan. 30, 2009  (FR) .................................... 09 50629

(51) Int. Cl.
*H03M 7/00* (2006.01)
(52) U.S. Cl.
USPC ............................................. 341/81; 341/88

(58) Field of Classification Search
USPC .................................................. 341/51, 81, 88
See application file for complete search history.

(56) References Cited

U.S. PATENT DOCUMENTS 6,670,898 B1 * 12/2003 Lifshitz .......................... 341/81
6,745,362 B1    6/2004 Carlach et al.
(Continued)

FOREIGN PATENT DOCUMENTS

FR    2782425 A1    2/2000

OTHER PUBLICATIONS

French Search Report dated Sep. 14, 2009 for corresponding French Application No. FR 0950629, filed Jan. 30, 2009.
(Continued)

*Primary Examiner* — Brian Young
(74) *Attorney, Agent, or Firm* — Westerman, Champlin & Koehler, P.A.; David D. Brush (57) ABSTRACT

A method is provided for encoding data to be sent to at least one receiver, including at least two identical encoding steps and at least one permutation step. Each encoding step associates a block of encoded data with a block of data to be encoded, using at least two basic codes, each code processing a subset of the data block to be encoded. The permutation step is inserted between two encoding steps, i.e. a current encoding step and a previous encoding step, such that the order of the data in a data block to be encoded by the current encoding step is different from the order of the data encoded by the previous encoding step. The permutation step implements, for a data block, a rotation applied to the data of the data block and a reversal of the order of the data of the data block. The operations can be implemented by an interleaving matrix.

12 Claims, 3 Drawing Sheets

(56) References Cited

U.S. PATENT DOCUMENTS

| | | | |
|---|---|---|---|
| 7,221,300 B2* | 5/2007 | Fontaine et al. | 341/136 |
| 7,684,505 B2* | 3/2010 | Rajagopal et al. | 375/265 |
| 7,711,060 B1* | 5/2010 | Lou et al. | 375/267 |

OTHER PUBLICATIONS

International Search Report and Written Opinion dated Aug. 3, 2010 for corresponding International Application No. PCT/EP2010/051125, filed Jan. 29, 2010.

Olocco G. Tillich J.P. "A Family of Self Dual Codes Which Behave in Many Respects like Random Linear Codes of Rate 1/2" Information Theory, 2001 Proceedings. 2001 IEEE International Symposium on, 2001, XP002541519.

Carlach J.C. et al., "A New Scheme for Building Good Self-Dual Block Codes" Information Theory, 2000. Proceedings. IEEE International Symposium on, 2000, XP002541521.

Battail G. "A Conceptual Framework for Understanding Turbo Codes," IEEE Journal on Selected Areas in Communications, vol. 16, No. 2, pp. 245-254, Feb. 1998.

Otmani A., "Codes Cortex et Constructions de Codes Auto-Duaux Optimax" These de Doctorat, Universite de Limoges, 2002.

Cadic E. "Construction de Turbo Codes Courts Possedant de Bonnes Proprietes de Distance Minimale" These de Doctorate, Universite de Limoges, 2003.

Leon J. S. "A Probabilistic Algorithm for Computing Minimum Weights of Large Error-Correcting Codes" IEEE Transactions on Information Theory, vol. 35, No. 5, pp. 1354-1359, Sep. 1988.

Carlach J. C. et al., "A New Family of Block Turbo-Codes" 13th International Symposium on Applied Algebra, Algebraic Algorithms and Error-Correcting Codes, Honolulu, USA, Nov. 1999.

English Translation of the International Preliminary Report on Patentability and Written Opinion dated Aug. 3, 2010 for corresponding International Application No. PCT/EP2010/051125, filed Jan. 29, 2010.

\* cited by examiner

METHOD FOR ENCODING DATA WITH AT LEAST TWO ENCODING STEPS, AND AT LEAST ONE PERMUTATION STEP, CORRESPONDING ENCODING DEVICE, COMPUTER PROGRAM AND SIGNAL

CROSS-REFERENCE TO RELATED APPLICATIONS

This Application is a Section 371 National Stage Application of International Application No. PCT/EP2010/051125, filed Jan. 29, 2010 and published as WO2010/086424 on Aug. 5, 2010, not in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The field of the disclosure is that of error correction encoding, to be used for the encoding of source data to deliver encoded pieces of data with a view to their transmission through transmission channels that could impair the transmitted signal. Error correction encoding enables receivers to reconstruct or rebuild the source signal despite the deterioration undergone especially during transmission, by decoding the received data.

There are many existing error correction codes. The disclosure pertains more precisely to the encoding that uses codes known as "Cortex codes".

BACKGROUND OF THE DISCLOSURE

Encoding techniques using Cortex codes were first presented by J. C. Carlach and C. Vervoux and have been the object especially of the patent FR-2 782 425. These Cortex codes are also described in "A New Family of Block Turbo-Codes" (J. Carlach and C. Vervoux, 13th International Symposium on Applied Algebra, Algebraic Algorithms and Error-Correcting Codes, Honolulu, USA, November 1999) and "A New Scheme for Building Good Self-Dual Block Codes" (J. Carlach, A. Otmani, and C. Vervoux, Information Theory, 2000. Proceedings. IEEE International Symposium, 25-30 Jun. 2000, p. 476).

These Cortex codes define a new family of error correction codes which, when implemented in encoding devices or encoders and decoding devices or decoders, enable an efficient correction of errors induced by the transmission. One characteristic of these codes is that they are constructed from elementary short codes $P_b$, or base codes, which enables the encoders and the decoders to be simplified.

Figure 1:
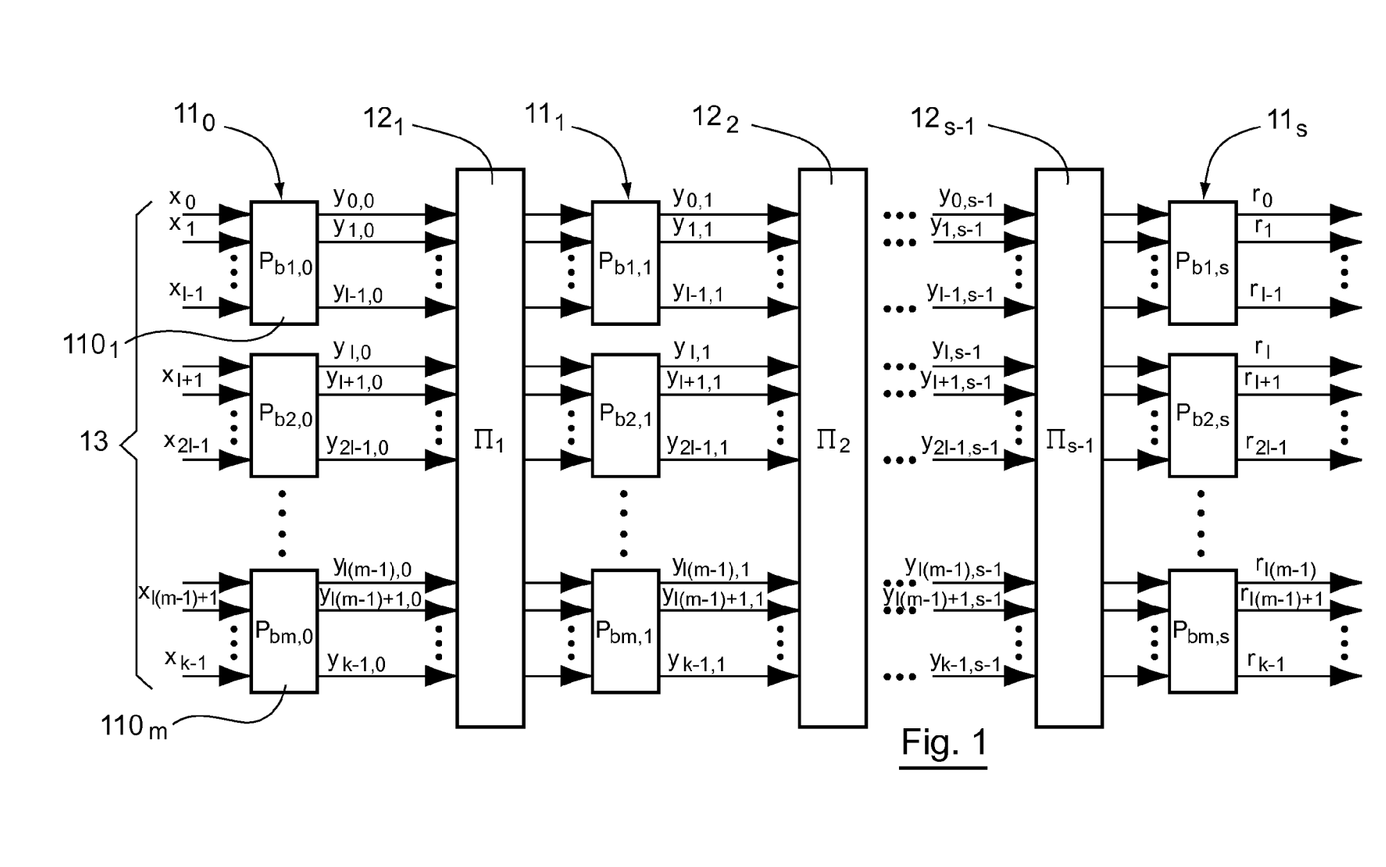
FIG. 1 illustrates an example of an encoder known per se using Cortex codes.

The encoding processing implemented in an encoder, illustrated in FIG. 1, relies on the implementing of several encoding means $11_1$ to $11_s$, and of permutation or interleaving means $12_1$ to $12_{s-1}$ inserted between two successive encoding modules. Such an encoder can especially integrate these different means in the form of one or more integrated circuits and/or a microprocessor implementing an appropriate program.

Thus, the process consists initially in distributing the k information bits $x_i$ of a source data block 13 among m sub-blocks. Then, these m sub-blocks are encoded separately by using base codes $121_1$ to $121_m$. The result $y_{0,0}$ to $y_{k-1,0}$ of this first encoding $12_1$ is recoded several times through s encoding modules to produce the k redundancy bits $r_i$. The total code obtained is therefore an encoding that produces a systematic code of rate ½.

Between two successive encoding means $11_i$ and $11_{i+1}$, the pieces of data $y_{i,j}$ called hidden variables are interleaved by an interleaver $\Pi_i$ $12_i$.

The document "A Family Of Self-Dual Codes Which Behave In Many Respects Like Random Linear Codes Of Rate ½" (G. Olocco and J. Tillich, Proceedings of the IEEE International Symposium on Information Theory, 24-29 Jun. 2001, p. 15) shows that if these interleavers are defined randomly and if their quantity (s−1) is relatively great, then the Cortex codes behave like random linear codes.

As explained by G. Battail, in "A Conceptual Framework for Understanding Turbo-Codes", IEEE Journal on Selected Areas in Communications, Vol. 16, No. 2, pp. 245-254, February 1998), the weights of the code thus have a distribution corresponding to the distribution of the optimum random codes. This building operation results in a total code having a large minimum distance.

The matrix P of an encoding means 11, if only one base code $P_b$ is used, may be represented by the equation (1):

$$P = \begin{bmatrix} P_b & 0_{l \times l} & \cdots & 0_{l \times l} \\ 0_{l \times l} & P_b & \cdots & 0_{l \times l} \\ \vdots & \vdots & \ddots & \vdots \\ 0_{l \times l} & 0_{l \times l} & \cdots & P_b \end{bmatrix} \quad (1)$$

The generator matrix $G_n$, of the total code thus built is given by the equation (2):

$$G_n = [I_k | P\Pi_1 P\Pi_2 \ldots \Pi_{s-1} P] \quad (2)$$

It can be the case that the matrices P are not identical if the base codes $P_b$ change according to the encoding stages. This fact, with different interleavers, implies that there is a large number of possibilities of making a same total code. An encoding stage may be formed by one or more integrated circuits, or may be implemented in software form in a microprocessor.

No building method is described either by the inventors of these codes (see documents already referred to) or in the literature pertaining thereto, and especially:

G. Olocco and J. Tillich, "A family of self-dual codes which behave in many respects like random linear codes of rate ½," in Proceedings of the IEEE International Symposium on Information Theory, 24-29 Jun. 2001, p. 15;

A. Otmani, "Codes Cortex et construction de codes auto-duaux optimaux" (Cortex codes and building of optimal self-dual codes), Ph.D. thesis, University of Limoges, 2002;

E. Cadic, "Construction de turbo codes courts possédant de bonnes propriétés de distance minimale," (Building of short turbo codes possessing high properties of minimum distance), Ph.D. thesis, University of Limoges, 2003.

It is therefore necessary to make an exhaustive search, i.e. to test all the possible interleavers. Their number is:

$$N_\Pi = (k!)^{s-1} \quad (3)$$

The task becomes soon impossible when k and s increase. For example, if the number of information bits is k=8 and if the number of encoding modules is s=3, then $6.5 \times 10^{13}$ interleavers need to be tested.

This number may be reduced if the first condition laid down is that of always using the same interleaving between the encoding stages, thus reducing the number of interleavers to be tested to:

$$N_\Pi = k! \quad (4)$$

This number however remains substantial. Thus, taking the above example again, there remain 40320 combinations to be tested.

Once the $N_\Pi$ interleavers have been defined, it is necessary to make sure of the validity of the minimum distance of the code built. Indeed, some of the k! possible combinations result in minimum distances that are far too small to be usable.

To determine the minimum distance, it is necessary to generate all the $2^k$ code words (giving 256 in the above example). And this must be done for each of the k! interleavers. When k is high, it is possible to use minimum distance estimation methods such as the one described by Leon J. S. in "A probabilistic algorithm for computing minimum weights of large error-correcting codes" (IEEE Transactions on Information Theory, vol. 35, n° 5, pp. 1354-1359, September 1988), but the computations are still lengthy and complex.

There is therefore no simple solution available for making encoders and decoders that use efficient Cortex codes, i.e. codes that have a large minimum distance.

SUMMARY

An aspect of the disclosure relates to a method for encoding data to be transmitted to at least one receiver comprising, according to the approach of the Cortex codes, at least two identical encoding steps and at least one permutation step.

Each encoding step associates, with a block of data to be encoded, a block of encoded data, using at least two base codes, each base code processing a subset of said block of data to be encoded. A permutation step is interposed between two encoding steps, a current encoding step and a previous encoding step, so that the order of the pieces of data of a block of data to be encoded by said current encoding step is different from the order of these pieces of data encoded by said previous encoding step.

Said data encoding steps are implemented respectively by distinct encoding modules of an encoder, to deliver encoded data, to be transmitted in a transmission channel, and being able to be decoded efficiently in an appropriate error correction decoder.

According to an embodiment of the invention, said permutation step implements the following sub-steps for a data block:
 applying rotation to the data of said data block; and
 inverting the order of the data of said data block.

Thus, an embodiment of the invention proposes a novel type of encoding using Cortex codes based on a particular permutation. Thereafter, a method for determining matrices adapted to this encoding is described. These interleavers ensure a large minimum distance, and are easy to define and implement in an encoder.

In practice, these operations are generally performed simultaneously, for example using an interleaving matrix. The total code can also be implemented in the form of a single generator matrix $G_n$, as explained here above.

The data encoding technique according to an embodiment of the invention proposes encoders that use Cortex codes, for which the building and therefore the implantation in encoders is greatly facilitated. The technique furthermore makes it possible to obtain symmetrical generator matrices $G_n$.

According to one particular implementation of the invention, said permutation step implements one of the following primary interleavings:

$$\Pi_1 = (k-1, k-2, k-3, \ldots, 1, k)$$

$$\Pi_2 = (1, k, k-1, k-2, \ldots, 2),$$

or a secondary interleaving obtained by permutations by successive blocks of the primary interleavings $\Pi_1$ or $\Pi_2$, the block of data to be permutated being delivered in an order numbered from 1 to k.

It will be understood that such an interleaving is very simple to implement.

In particular, said primary interleavings can implement the following k*k matrices:

$$\Pi_1 = \begin{bmatrix} 0 & 0 & 0 & \ldots & 0 & 1 & 0 \\ 0 & \vdots & \vdots & 0 & 1 & 0 & 0 \\ \vdots & 0 & 0 & \ddots & 0 & 0 & 0 \\ 0 & 0 & 1 & \ldots & 0 & 0 & 0 \\ 0 & 1 & 0 & \ldots & \vdots & \vdots & \vdots \\ 1 & 0 & 0 & \ldots & 0 & 0 & 0 \\ 0 & 0 & 0 & \ldots & 0 & 0 & 1 \end{bmatrix} \quad \Pi_2 = \begin{bmatrix} 1 & 0 & 0 & \ldots & 0 & 0 & 0 \\ 0 & \vdots & \vdots & \ldots & 0 & 0 & 1 \\ \vdots & 0 & 0 & \ldots & 0 & 1 & 0 \\ 0 & 0 & 0 & \ldots & 1 & 0 & 0 \\ 0 & 0 & 0 & \ddots & \vdots & \vdots & \vdots \\ 0 & 0 & 1 & \ldots & 0 & 0 & 0 \\ 0 & 1 & 0 & \ldots & 0 & 0 & 0 \end{bmatrix}$$

It can also be provided, without modifying the efficiency of the interleaving, that the order of the lines of base codes will be permutated relatively to a first reference structure implementing one of said primary interleavings, and that said permutation step will apply a secondary interleaving obtained from said primary interleaving in preserving, relatively to said reference structure:
 the order of the inputs of the previous encoding step i;
 the order of the outputs of the next encoding step i+1;
 the connections to the base codes of the next encoding step i+1.

In one particular embodiment of the invention, at least one of said base codes is a (4, 2, 2) Hadamard code.

This base code is indeed simple to implement and makes it possible, in combination with an interleaving as described here above, to obtain efficient error correction encoding results.

According to one particular approach, the method of an embodiment of the invention implements a generator matrix $G_n$ such that:

$$G_n = [I_k | P \Pi P \Pi \ldots \Pi P]$$

where
 $I_k$ is an identity matrix;
 P a matrix representing one of said encoding steps;
 $\Pi$ is one of said primary or secondary interleaving matrices.

The method may then comprise a step of transmission to said receiver or receivers of a set of data comprising on the one hand source data, feeding the first encoding step, and on the other hand redundancy data delivered by the last encoding step.

An embodiment of the invention also pertains to a device for encoding data to be transmitted to at least one receiver implementing the method described here above. Such a device comprises at least two identical encoding means or encoding modules and at least one permutation module, each encoding module associating, with a block of data to be encoded, a block of encoded data, using at least two base encoders, each base encoder processing one subset of said block of data to be encoded and a permutation module being interposed between two encoding modules, a current encoding module and a previous encoding module, so that the order of the pieces of data of a block of data to be encoded by said current encoding module is different from the order of these pieces of data encoded by said previous encoding module.

According to an embodiment of the invention, said permutation module comprises:

means for rotating the data of a data block; and
means for inverting the order of the data of said data block.

These rotation and inverting means can be made in the form of the following primary interleaving means:

$$\Pi_1 = (k-1, k-2, k-3, \ldots, 1, k)$$

$$\Pi_2 = (1, k, k-1, k-2, \ldots, 2),$$

or secondary interleaving means, obtained by permutations by successive blocks of the primary interleavings $\Pi_1$ or $\Pi_2$, the block of data to be permutated being delivered in an order numbered from 1 to k.

Thus, an encoding device according to an embodiment of the invention provides for the efficient encoding of data to be transmitted, with a large minimum distance.

Such a device can also include means for sending a set of data to said receiver or receivers, this set of data comprising on the one hand source data feeding the first encoding step, and on the other hand redundancy data delivered by the last encoding step.

An embodiment of the invention also pertains to a signal comprising data blocks sent or to be sent to at least one receiver and representing source data blocks, and encoded according to the encoding method described here above.

An embodiment of the invention also pertains to a computer program product downloadable from a communications network and/or recorded on a computer-readable medium and/or executable by a processor, characterized in that it comprises program code instructions to implement the encoding method described here above.

An embodiment of the invention also pertains to the data carriers carrying such a computer program, or a signal encoded by the method of an embodiment of the invention.

An embodiment of the invention also pertains to a signal transmission method and a device implementing the encoding method described here above and a step for transmitting a signal comprising at least one part of the source data and at least one part of the encoded data.

BRIEF DESCRIPTION OF THE DRAWINGS

Other features and advantages shall appear more clearly from the following description of a preferred embodiment of the invention given by way of a simple, illustrative and non-exhaustive example and from the appended figures of which.

DETAILED DESCRIPTION OF ILLUSTRATIVE EMBODIMENTS

Figure 5:
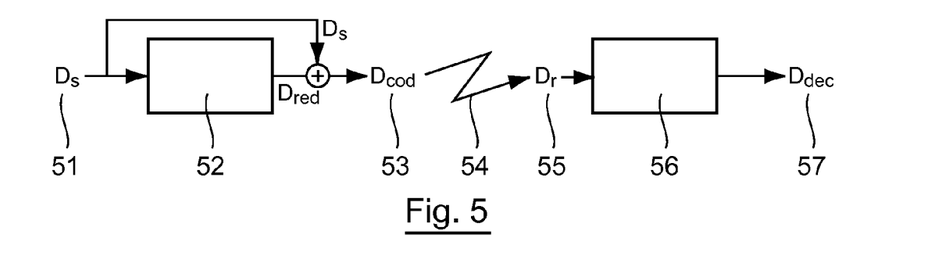
FIG. 5 presents an example of an encoding device according to an embodiment of the invention.

Referring to FIG. 5, we present a communications system using a data encoding device 52 according to an embodiment of the invention. From source data Ds 51, the encoding device delivers redundancy data Dred determined by means of a Cortex code according to an embodiment of the invention. This encoding device delivers data that can include all or part of the source data Ds 51 and redundancy data Dred, together forming data Dcod 53, intended for transmission through a channel 54 to at least one receiver 56 comprising at least one decoder. This decoder is capable of correcting the transmission errors using the received data Dr 55 which includes redundancy data Dred, and of delivering decoded data Ddec 57.

The encoding device 52 of an embodiment of the invention implements a method as described here below.

Such a device comprises at least two identical encoding means or encoding modules and at least one permutation module, each encoding module associating, with a block of source data to be encoded, a block of data encoded using at least two base encoders, each base encoder processing a subset of said block of data to be encoded, and a permutation module being interposed between two encoding modules, a current encoding module and a previous encoding module, so that the order of the pieces of data of a block of data to be encoded by said current encoding module is different from the order of these pieces of data encoded by said previous encoding module.

An embodiment of the invention therefore proposes an encoding using novel Cortex codes, built simply and efficiently through steps implemented in the methods, or encoding modules in the devices, for interleaving, which may be obtained by combining two sub-steps, applied to a block of k pieces of data:

a rotation, i.e. shift of the data of this block i→i+1, and k→1, which if necessary, can be repeated several times (or which can provide for a shift by a value greater than 1);

an inversion of the order of the data, which amounts to reordering the pieces of data in reading them by the end: k→1, k−1→2 . . . .

In the expression x→y, x designates the index (between 1 and k) of one of the pieces of data of the block of k pieces of data before the performance of the sub-step (rotation or inversion) and y designates the corresponding index after the sub-step has been performed.

The rotation can be done before or after the inversion. Advantageously, these two sub-steps can be performed simultaneously, especially using matrices.

In particular, an embodiment of the invention can implement one of the two interleavers known as primary interleavers, described here below, and/or interleavers known as secondary interleavers which can be deduced from these primary interleavers.

1. Primary Interleavers

The primary interleavers can be described by the following matrices k×k:

$$\Pi_1 = \begin{bmatrix} 0 & 0 & 0 & \ldots & 0 & 1 & 0 \\ 0 & \vdots & \vdots & & 0 & 1 & 0 & 0 \\ \vdots & 0 & 0 & \cdot\cdot & 0 & 0 & 0 \\ 0 & 0 & 1 & \ldots & 0 & 0 & 0 \\ 0 & 1 & 0 & \ldots & \vdots & \vdots & \vdots \\ 1 & 0 & 0 & \ldots & 0 & 0 & 0 \\ 0 & 0 & 0 & \ldots & 0 & 0 & 1 \end{bmatrix} \quad (5)$$

$$\Pi_2 = \begin{bmatrix} 1 & 0 & 0 & \ldots & 0 & 0 & 0 \\ 0 & \vdots & \vdots & \ldots & 0 & 0 & 1 \\ \vdots & 0 & 0 & \ldots & 0 & 1 & 0 \\ 0 & 0 & 0 & \ldots & 1 & 0 & 0 \\ 0 & 0 & 0 & \cdot\cdot & \vdots & \vdots & \vdots \\ 0 & 0 & 1 & \ldots & 0 & 0 & 0 \\ 0 & 1 & 0 & \ldots & 0 & 0 & 0 \end{bmatrix} \quad (6)$$

For $\Pi_1$, the first output of the encoding module i is connected to the $(k-1)^{th}$ input of the encoding module i+1; the second output of the $(k-2)^{th}$ input and so on and so forth. For $\Pi_2$, the first output of the encoding module i is connected to the first input of the encoding module i+1; the second output of the $k^{th}$ input and so on and so forth (in the encoder as illustrated in FIG. 1, the outputs deliver interleaved data items, and as a function of the data received at the inputs).

It is also possible to describe $\Pi_1$ and $\Pi_2$ by the following expressions which are sometimes more convenient to use than the matrix notations:

$$\Pi_1 = (k-1, k-2, k-3, \ldots, 1, k) \quad (7)$$

$$\Pi_2 = (1, k, k-1, k-2, \ldots, 2) \quad (8)$$

Figure 2A:
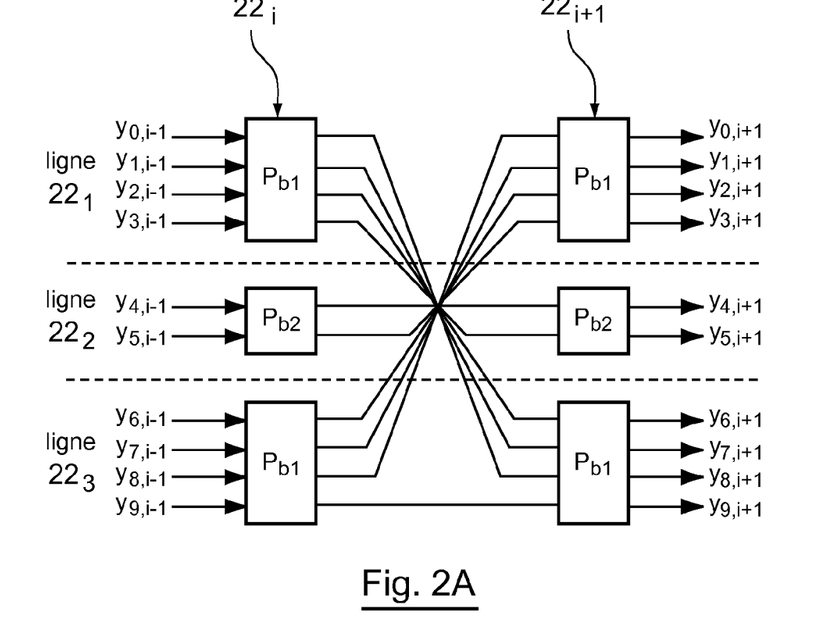
FIGS. 2A and 2B present two examples of primary interleavers $\Pi_1$ and $\Pi_2$ respectively.
Figure 2B:
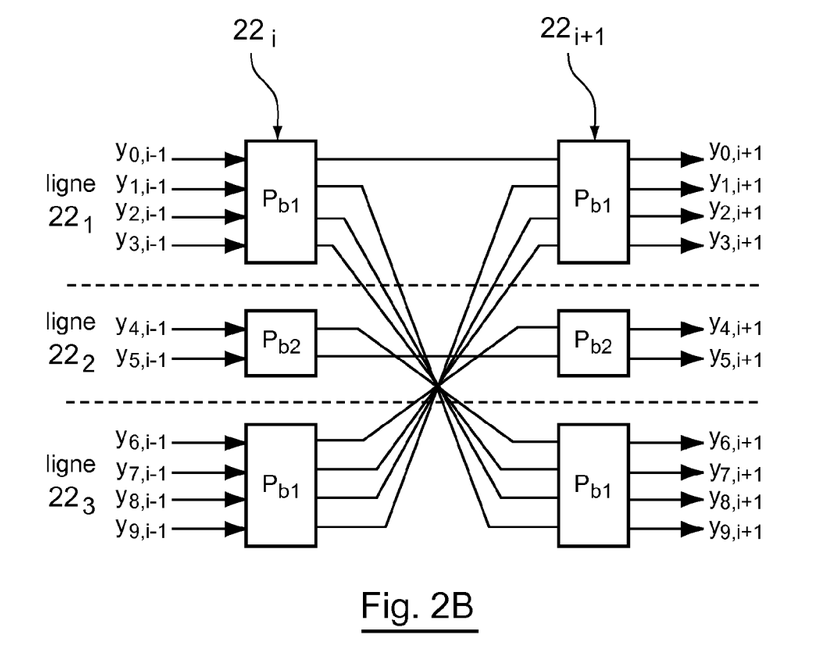

FIGS. 2A and 2B illustrate two examples of interleaving, respectively using the interleavers $\Pi_1$ and $\Pi_2$ for k=10. The encoding modules $31_i$ and $31_{i+1}$ are, in this example, formed by two different base codes, namely $P_{b1}$ of length 4 and $P_{b2}$ of length 2.

2. Secondary Interleavers

From the two primary interleavers described here above, it is possible to determine all the secondary interleavers offering the same minimum distance.

Figure 3:
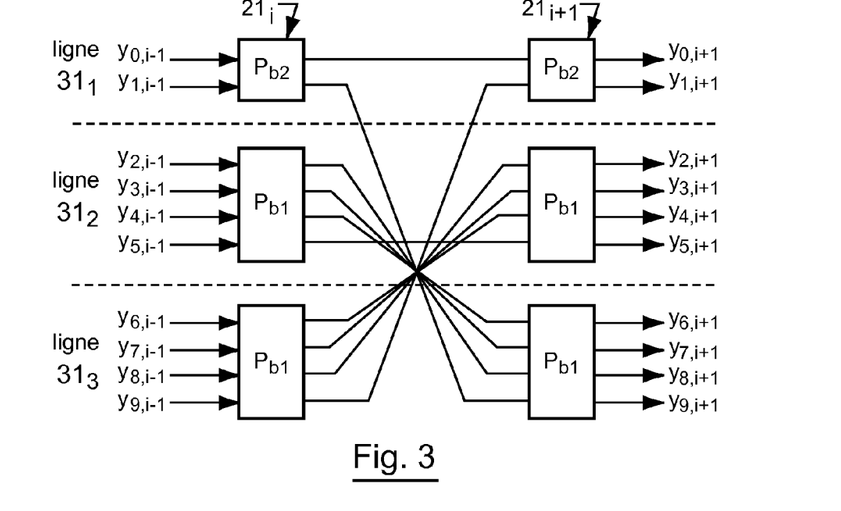
FIG. 3 illustrates a secondary interleaver obtained by permutation of the encoding lines of the interleaver of FIG. 2A.

As illustrated in FIG. 3, which illustrates a secondary interleaver obtained by permutation of the encoding lines $31_1$ to $31_3$ (corresponding respectively to the lines $21_2$, $21_3$ and $21_1$ of the encoding lines of FIG. 2A), it is enough indeed to:

permutate the m encoding lines (m corresponding to the m sub-blocks of information bits, m=3 in the example of FIG. 3),
preserve the connections to the blocks of the encoding module i,
preserve the order of the inputs of the encoding module i,
preserve the order of the outputs of the encoding module i+1.

In other words, it is possible to obtain a secondary interleaver simply by modifying the order of the encoding lines (i.e. the order of the base codes in the same way in each of the modules) without modifying the connections between the outputs of the base codes of the encoding module i and the inputs of the base codes of the encoding module i+1 (the order of the values $y_{0,i-1}$ to $y_{m,i-1}$ and of the values $y_{0,i+1}$ to $y_{m,i+1}$ remaining of course unchanged).

Each primary interleaver $\Pi_1$ and $\Pi_2$ thus makes it possible to obtain m! interleavers. However, owing to the cyclicity nature of the primary interleavers, half of the secondary interleavers obtained with $\Pi_1$ are equivalent to half of the secondary interleavers obtained with $\Pi_2$.

All these interleavers are used to obtain the same minimum distance. In taking up the above example again, with k=8 and s=3, with the base code having a length of 2, we obtain 24 interleavers which provide for the same minimum distance of 5.

3. Secondary Encoding

A primary encoding (i.e. one using primary interleavers, in this case $\Pi_1$) with n+1 encoding modules P and n interposed interleaving modules $\Pi_1$ can be written in the form of the following generator matrix:

$$G = P\Pi_1 P\Pi_1 \ldots \Pi_1 P$$

It is then possible to build the secondary encoding G' using block-wise permutation matrices $\Pi_{AV}$, $\Pi_{AR}$ (sized by a corresponding matrix $P_i$ constituting P, i.e. the constraint is that of a block-wise permutation corresponding to the elementary codes $P_i$) in the following form:

$$\begin{aligned} G' &= (\Pi_{AV} P \Pi_{AR}) \Pi_1 (\Pi_{AV} P \Pi_{AR}) \Pi_1 \ldots \Pi_1 (\Pi_{AV} P \Pi_{AR}) \\ &= (\Pi_{AV} \Pi'_{AR} P') \Pi_1 (\Pi_{AV} \Pi'_{AR} P') \Pi_1 \ldots \Pi_1 (\Pi_{AV} \Pi'_{AR} P') \\ &= (\Pi_{AV} \Pi'_{AR}) P' (\Pi_1 \Pi_{AV} \Pi'_{AR}) P' (\Pi_1 \ldots \Pi_1 \Pi_{AV} \Pi'_{AR}) P' \\ &= (\Pi_{AV} \Pi'_{AR}) P' \Pi'_1 P' \Pi'_1 \Pi'_1 P' \end{aligned}$$

P' is a matrix for encoding by sub-blocks such as P. The last permutation ($\Pi_{AV} \Pi'_{AR}$) contributes nothing in terms of encoding, and can therefore be eliminated, to give the secondary encoding delivering a secondary code of the following type:

$$G'' = P \Pi'_1 P \Pi'_1 \ldots \Pi'_1 P'.$$

As already stated, this code G" gives the same performances as the primary code G.

It can also be noted that the building of the code according to the approach of an embodiment of the invention and therefore of a corresponding encoder and/or encoding method is completely modular, and that it is easy to increase the minimum distance of the total code by adding encoding modules to the s modules already present (by the addition of encoding modules). It is thus possible to improve the performances of an encoder by adding encoding stages.

4. Examples of Encoders Using the Encoding Method According to an Embodiment of the Invention The table I here below gives a non-exhaustive list of encoders of rate ½ built from the (4, 2, 2) Hadamard code and obtained according to the encoding approach described here above.

TABLE I

RATE ½ ENCODERS BUILT ACCORDING
TO AN EMBODIMENT OF THE INVENTION

| Number of information bits k | Encoding modules s (min) | Maximum minimal distance obtained | Maximum theoretical minimal distance |
|---|---|---|---|
| 4 | 3 | 4 | 4 |
| 8 | 3 | 5 | 5 |
| 12 | 5 | 6 | 8 |
| 24 | 10 | 9 | 12 |
| 48 | 20 | 15 | 16 |
| 64 | 19 | 16 | 22 |
| 96 | 40 | 26 | 28 |
| 102 | 41 | 28 | 28 |

TABLE I-continued

RATE ½ ENCODERS BUILT ACCORDING
TO AN EMBODIMENT OF THE INVENTION

| Number of information bits k | Encoding modules s (min) | Maximum minimal distance obtained | Maximum theoretical minimal distance |
|---|---|---|---|
| 122 | 62 | 34 | 35 |
| 138 | 61 | 36 | ? |
| 150 | 61 | 36 | ? |

The maximum of the minimal distance was obtained either exhaustively or by estimation (according to the method described by Leon in the already-mentioned document).

By way of a comparison, for k=96, a convolutive turbocode of rate ½ such as the one chosen for the DVB-RCS standard has a minimum distance of 13, while a Cortex code obtained according to the encoding method of an embodiment of the invention has a minimum distance of 26.

Figure 4:
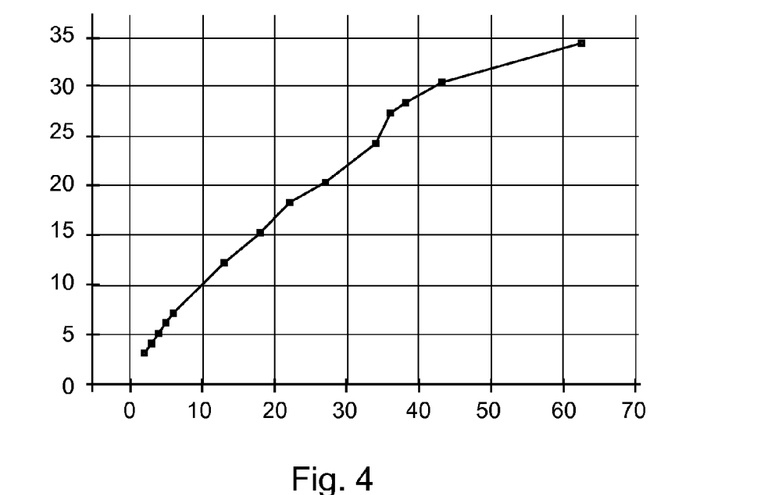
FIG. 4 is a curve illustrating the increase in the minimum distance as a function of the number of encoding modules s used for a code with a length 2k=244.

The modularity of the building of an encoder, or of an encoding method, i.e. the possibility of increasing the minimum distance for a fixed code length by adding encoding modules or encoding steps respectively is illustrated in FIG. 4 for 122 information bits (giving a total of 244 bits). The curve represents the increase in the minimum distance as a function of the number of encoding modules s.

An embodiment of the invention provides a data encoding technique, which simply and systematically implements Cortex codes ensuring a large minimum distance between the encoded pieces of data.

An embodiment of the invention provides a data encoding technique that is relatively simple to implement for a software or hardware implantation on a machine.

Although the present disclosure has been described with reference to one or more examples, workers skilled in the art will recognize that changes may be made in form and detail without departing from the scope of the disclosure and/or the appended claims.

The invention claimed is:

1. A method for encoding data to be transmitted to at least one receiver, comprising:
    at least two identical encoding steps, each encoding step associating, with a block of data to be encoded, a block of encoded data, using at least two base codes, each base code being used for encoding a subset of said block of data to be encoded, and
    at least one permutation step, each permutation step being interposed between two encoding steps, called a current encoding step and a previous encoding step, so that the order of pieces of data of the block of data to be encoded by said current encoding step is different from the order of these pieces of data encoded by said previous encoding step, and wherein said permutation step implements the following sub-steps for said block of data:
    applying a shift to the pieces of data of said block of data; and
    inverting the order of the pieces of data of said block of data.

2. The method for encoding according to claim 1, wherein said permutation step implements one of the following primary interleavings:

$$\Pi_1 = (k-1, k-2, k-3, \ldots, 1, k)$$

$$\Pi_2 = (1, k, k-1, k-2, \ldots, 2),$$

or a secondary interleaving obtained by permutations by successive blocks of the primary interleavings $\Pi_1$ or $\Pi_2$,
the block of data to be permutated being delivered in an order numbered from 1 to k.

3. The method for encoding according to claim 2, wherein said primary interleavings implement the following k*k matrices:

$$\Pi_1 = \begin{bmatrix} 0 & 0 & 0 & \ldots & 0 & 1 & 0 \\ 0 & \vdots & \vdots & 0 & 1 & 0 & 0 \\ \vdots & 0 & 0 & \cdot\cdot\cdot & 0 & 0 & 0 \\ 0 & 0 & 1 & \ldots & 0 & 0 & 0 \\ 0 & 1 & 0 & \ldots & \vdots & \vdots & \vdots \\ 1 & 0 & 0 & \ldots & 0 & 0 & 0 \\ 0 & 0 & 0 & \ldots & 0 & 0 & 1 \end{bmatrix} \quad \Pi_2 = \begin{bmatrix} 1 & 0 & 0 & \ldots & 0 & 0 & 0 \\ 0 & \vdots & \vdots & \ldots & 0 & 0 & 1 \\ \vdots & 0 & 0 & \ldots & 0 & 1 & 0 \\ 0 & 0 & 0 & \ldots & 1 & 0 & 0 \\ 0 & 0 & 0 & \cdot\cdot\cdot & \vdots & \vdots & \vdots \\ 0 & 0 & 1 & \ldots & 0 & 0 & 0 \\ 0 & 1 & 0 & \ldots & 0 & 0 & 0 \end{bmatrix}.$$

4. The method for encoding according to claim 2, wherein the order of the lines of the base codes is permutated relatively to a first reference structure implementing one of said primary interleavings, and wherein said permutation step applies a secondary interleaving obtained from said primary interleaving in preserving, relatively to said reference structure:
    the order of the inputs of the previous encoding step i;
    the order of the outputs of the next encoding step i+1;
    the connections to the base codes of the next encoding step i+1.

5. The method for encoding according to claim 1, wherein at least one of said base codes is a (4, 2, 2) Hadamard code.

6. The method for encoding according to claim 3, wherein the method implements a generator matrix $G_n$ such that:

$$G_n = [I_k \nabla P \Pi P \Pi \ldots \Pi P]$$

where $I_k$ is an identity matrix;
P a matrix representing one of said encoding steps;
Π is one of said primary or secondary interleaving matrices.

7. The method for encoding according to claim 1, wherein the method comprises a step of transmission, to said at least one receiver, of source data feeding the first encoding step, and of redundancy data delivered by the last encoding step.

8. A device for encoding data to be transmitted to at least one receiver, the device comprising:
    at least two identical encoding modules, each encoding module associating, with a block of data to be encoded, a block of data encoded by using at least two base encoders, each base encoder processing one subset of said block of data to be encoded, and
    at least one permutation module, each permutation module being interposed between two encoding modules, called a current encoding module and a previous encoding module, so that the order of pieces of data of the block of data to be encoded by said current encoding module, is different from the order of these pieces of data encoded by said previous encoding module, wherein said permutation module comprises:
    means for applying a shift to the pieces data of said block of data; and
    means for inverting the order of the pieces of data of said block of data.

9. The device for encoding according to claim 8, wherein said permutation module implements one of the following primary interleavings:

$$\Pi_1 = (k-1, k-2, k-3, \ldots, 1, k)$$

$$\Pi_2 = (1, k, k-1, k-2, \ldots, 2),$$

or a secondary interleaving obtained by permutations by successive blocks of the primary interleaving $\Pi_1$ or $\Pi_2$,
the block of data to be permutated being delivered in an order numbered from 1 to k.

10. The device for encoding according to claim 8, wherein the device comprises means for sending, to said at least one receiver, source data feeding the first encoding step, and redundancy data delivered by the last encoding step.

11. The method of claim 1, wherein the method comprises:
generating an encoded signal comprising said block of encoded data; and
transmitting the encoded signal to the at least one receiver.

12. A computer program product recorded on a non-transitory computer-readable medium and executable by a processor, wherein the computer program product comprises program code instructions to implement method for encoding data to be transmitted to at least one receiver, when the instructions are executed on the processor, wherein the method comprises:

at least two identical encoding steps, each encoding step associating, with a block of data to be encoded, a block of encoded data, using at least two base codes, each base code being used for encoding a subset of said block of data to be encoded, and at least one permutation step, each permutation step being interposed between two encoding steps, called a current encoding step and a previous encoding step, so that the order of pieces of data of the block of data to be encoded by said current encoding step is different from the order of these pieces of data encoded by said previous encoding step, and wherein said permutation step implements the following sub-steps for said block of data:
applying a shift to the pieces of data of said block of data; and
inverting the order of the pieces of data of said block of data.

* * * * *

UNITED STATES PATENT AND TRADEMARK OFFICE
CERTIFICATE OF CORRECTION

PATENT NO.         : 8,587,459 B2                                                              Page 1 of 1
APPLICATION NO. : 13/147354
DATED              : November 19, 2013
INVENTOR(S)        : Perez Chamorro et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 200 days.

Signed and Sealed this
Twenty-second Day of September, 2015

Michelle K. Lee
*Director of the United States Patent and Trademark Office*

UNITED STATES PATENT AND TRADEMARK OFFICE
CERTIFICATE OF CORRECTION

PATENT NO.         : 8,587,459 B2                               Page 1 of 1
APPLICATION NO.    : 13/147354
DATED              : November 19, 2013
INVENTOR(S)        : Jorge Perez Chamorro et al.

It is certified that error appears in the above-identified patent and that said Letters Patent is hereby corrected as shown below:

Claims

In Column 10, line 32, claim 6, delete

"$G_n = [I_k \nabla P \Pi P \Pi \ldots \Pi P]$"

and insert

--$G_n = [I_k / P \Pi P \Pi .. \Pi P]$--.

Signed and Sealed this
Ninth Day of February, 2016

Michelle K. Lee
*Director of the United States Patent and Trademark Office*